US010304375B2

(12) United States Patent
Chen et al.

(10) Patent No.: US 10,304,375 B2
(45) Date of Patent: May 28, 2019

(54) MICRO DISPLAY PANELS WITH INTEGRATED MICRO-REFLECTORS

(71) Applicant: Hong Kong Beida Jade Bird Display Limited, Hong Kong (HK)

(72) Inventors: Yijing Chen, Jiaxing (CN); Fang Ou, Monterey Park, CA (US); Wing Cheung Chong, Tseung Kwan O (HK); Lei Zhang, Albuquerque, NM (US); Qiming Li, Albuquerque, NM (US)

(73) Assignee: HONG KONG BEIDA JADE BIRD DISPLAY LIMITED, Hong Kong (HK)

( * ) Notice: Subject to any disclaimer, the term of this patent is extended or adjusted under 35 U.S.C. 154(b) by 0 days.

(21) Appl. No.: 15/711,965

(22) Filed: Sep. 21, 2017

(65) Prior Publication Data

US 2018/0090058 A1    Mar. 29, 2018

Related U.S. Application Data

(60) Provisional application No. 62/399,203, filed on Sep. 23, 2016.

(51) Int. Cl.
| | | |
|---|---|---|
| *G09G 3/32* | (2016.01) | |
| *H01L 25/075* | (2006.01) | |
| *H01L 33/60* | (2010.01) | |
| *G09G 3/20* | (2006.01) | |

(52) U.S. Cl.
CPC ......... *G09G 3/32* (2013.01); *H01L 25/0753* (2013.01); *G09G 3/2003* (2013.01); *G09G 2300/0426* (2013.01); *G09G 2300/0452* (2013.01); *H01L 33/60* (2013.01)

(58) Field of Classification Search
CPC .................................................. A01K 63/003
See application file for complete search history.

(56) References Cited

U.S. PATENT DOCUMENTS

| | | |
|---|---|---|
| 5,715,022 A | 2/1998 | Takamatsu et al. |
| 8,642,363 B2 | 2/2014 | Lau et al. |
| 9,977,152 B2 | 5/2018 | Zhang et al. |

(Continued)

OTHER PUBLICATIONS

PCT International Search Report and Written Opinion, PCT Application No. PCT/US17/53081, dated Nov. 30, 2017, 12 pages.

(Continued)

*Primary Examiner* — Tony O Davis
(74) *Attorney, Agent, or Firm* — Fenwick & West LLP

(57) ABSTRACT

A display panel with integrated micro-reflectors. The display panel also includes an array of pixel light sources (e.g., micro-LEDs) electrically coupled to corresponding pixel driver circuits (e.g., FETs). The micro-LEDs produce light and the micro-reflectors reduce the divergence of the light produced by the micro-LEDs. Different designs are possible. The micro-reflectors can have different shapes, include the shape of their sidewalls and the shape of their plan cross-section. The array schemes can also vary, including the number of LEDs per micro-reflector. Different fabrication approaches are also possible. In one approach, a support structure is integrated between micro-LEDs. The sides of the support structure are reflective and serve as the reflective sidewalls of the micro-reflector. Alternately, the LED mesa itself can serve as the support structure.

20 Claims, 15 Drawing Sheets

(56) References Cited

U.S. PATENT DOCUMENTS

| | | |
|---|---|---|
| 10,068,888 B2 | 9/2018 | Zhang et al. |
| 10,078,158 B2 | 9/2018 | Zhang et al. |
| 10,079,264 B2 | 9/2018 | Zhang et al. |
| 2001/0004251 A1 | 6/2001 | Kurematsu et al. |
| 2004/0027675 A1 | 2/2004 | Wu et al. |
| 2005/0061950 A1 | 3/2005 | Jiang et al. |
| 2005/0180020 A1 | 8/2005 | Steenblik et al. |
| 2006/0169993 A1* | 8/2006 | Fan ............... H01L 27/153 257/88 |
| 2008/0111983 A1 | 5/2008 | Singer et al. |
| 2011/0215342 A1* | 9/2011 | Oliver ............. B29C 43/18 257/81 |
| 2012/0092747 A1 | 4/2012 | Martin et al. |
| 2013/0181195 A1 | 7/2013 | Cho et al. |
| 2013/0194165 A1 | 8/2013 | Tanaka et al. |
| 2013/0207964 A1 | 8/2013 | Fleck et al. |
| 2014/0008667 A1 | 1/2014 | Lau et al. |
| 2015/0341619 A1* | 11/2015 | Meir ............... G01S 17/06 348/47 |
| 2017/0068362 A1 | 3/2017 | Den Boer et al. |
| 2017/0069609 A1 | 3/2017 | Zhang et al. |
| 2017/0255011 A1* | 9/2017 | Son ................ G02B 5/3025 |

OTHER PUBLICATIONS

PCT International Search Report and Written Opinion, PCT Application No. PCT/US16/67787, dated Mar. 14, 2017, 17 pages.
United States Office Action, U.S. Appl. No. 15/269,956, dated Dec. 1, 2017, 14 pages.
United States Office Action, U.S. Appl. No. 15/272,410, dated Feb. 16, 2018, 8 pages.

* cited by examiner

MICRO DISPLAY PANELS WITH INTEGRATED MICRO-REFLECTORS

CROSS-REFERENCE TO RELATED APPLICATION(S)

This application claims priority under 35 U.S.C. § 119(e) to U.S. Provisional Patent Application Ser. No. 62/399,203, "On-chip Microstructuring for Compact, High Brightness Micro-Display and Projection," filed Sep. 23, 2016. The subject matter of all of the foregoing is incorporated herein by reference in their entirety.

BACKGROUND

1. Technical Field

This disclosure relates generally to display panels, especially display panels based on micro-LED arrays, integrated with micro-optics.

2. Description of Related Art

Digital display technology has become one of the largest branches in the field of modern electronics and optoelectronics and generates demands in various applications where an image forming function is needed. Among those applications, projection-based display, which has the potential of generating a large size image with low cost, is of great interest.

In a conventional projection system based on a passive imager device, such as liquid crystal display (LCD), digital mirror devices (DMD), and liquid crystal on silicon (LCOS), the passive imager device itself does not emit light. Specifically, the conventional projection system projects images by optically modulating collimated light emitted from a light source, i.e., by either transmitting, e.g., by an LCD panel, or reflecting, e.g., by a DMD panel, part of the light at the pixel level. However, the part of the light that is not transmitted or reflected is lost, which reduces the efficiency of the projection system. Furthermore, to provide the collimated light, complex illumination optics is required to collect divergent light emitted from the light source. The illumination optics not only causes the system to be bulky but also introduces additional optical loss into the system, which further impacts the performance of the system. In a conventional projection system, typically less than 3% of the illumination light generated by the light source reaches the projection screen to form an image.

With the rapid technology development of III-V compound semiconductor in recent years, inorganic R-G-B light emitting diodes (LEDs) with high brightness, high efficiency, and high durability are now widely available for lighting and large area matrix display. However, LED is typically used as a backlight source in the conventional projection systems. This does not change the fundamentals of the light loss mechanism associated with the conventional projection systems.

Instead of being a passive lighting unit, LEDs can be miniaturized and act as pixel light emitters in a micro-display system. Micro-LED arrays can be monolithically integrated with active-matrix display drivers, forming a self-emissive LED-based micro-display and providing significantly higher light efficiency and better color performance. For example, in such an active matrix LED (AM-LED) micro display, each pixel includes one micro-LED electrically coupled to one pixel driver circuitry. Each micro-LED is individually driven by its corresponding pixel driver circuitry, and all the individually driven micro-LEDs collectively form an image.

However, the light emitted by the micro-LED is generated from spontaneous emission and is thus not directional, resulting in a large divergence angle. The large divergence angle can cause various problems in an LED display. For example, in a projection system employing an AMLED micro display as a self-emissive imager device, a projection lens or a projection lens set is typically needed to project the image onto a screen. The projection lens typically has a limited numerical aperture. Thus, due to the large divergence angle of the LED dies, only a small portion of the light emitted by the micro-LEDs can be collected by the projection lens. This significantly reduces the efficiency and brightness of the AMLED micro display based projection system. As another example, due to the large divergence angle, the light emitted by one micro-LED pixel can illuminate its adjacent pixels, resulting in light crosstalk between pixels, loss of sharpness, and loss of contrast.

One approach for reducing the divergence angle of a AMLED micro display features an integrated microlens array, with each microlens positioned over one micro-LED to reduce the divergence of the emitted light. An optical spacer is formed between the micro-LED and microlens array to reduce the divergence angle of the light. Limited by the pixel size of the display and the intrisinc optical characteristics, the microlens array typically is effective in manipulating only the central portion of the light from the micro-LED (typically <+/−45 degrees), leaving the rest of the light emitted at more oblique angles to be wasted. Typically, the power from the non-central portion (e.g. 45~90 degrees) is significantly higher than the power in the central portion (e.g. 0~45 degrees) due to the much larger solid angle. Due to their geometry, micro-LEDs almost always produce a significant amount of light emitted at these oblique angles, which cannot be effectively collected by the corresponding microlens on top. In addition to wasting power, obliquely emitted light may also be collected by the adjacent microlens, causing cross-talk and reducing the image contrast.

As a result, there is a need for an AMLED micro display panel with reduced divergence angle and suppressed inter-pixel light crosstalk, for example for use in high-brightness, high-contrast and power-efficient projection and display applications.

SUMMARY

As one example, the present disclosure overcomes the limitation of the prior art by providing a AMLED micro display panel with integrated micro-reflector array for high-brightness, high-contrast and power-efficient micro-display. The AMLED micro display panel features an array of micro-LEDs electrically coupled to the corresponding pixel driver circuits. A micro-reflector is integrated with each micro-LED or each display pixel comprising multiple micro-LEDs (typically involving R, G, B color micro-LEDs) to reduce the divergence of light and simultaneously reduce the light crosstalk between adjacent pixels. The micro-reflector typically is responsible for manipulating the oblique-angle light, which is more efficient than the microlens configuration in collecting and converging this light for high-brightness and power-efficient display. For the projection application, this improves the projection brightness and contrast, and therefore reduces the power consumption. For the direct-view application, improving the light-emission directionality of the display can better protect the user's privacy.

Different designs are possible. The micro-reflectors can have different shapes, include the shape of their sidewalls and the shape of their plan cross-section. The array schemes can also vary, including the number of micro-LEDs per micro-reflector. Different fabrication approaches are also possible. In one approach, a support structure is integrated on the substrate between micro-LEDs. The sides of the support structure are reflective and serve as the reflective sidewalls of the micro-reflector. Alternately, the LED mesa itself can serve as the support structure.

In another aspect, the reflective metal coating of the micro-reflectors can also serve as electrical connections, for example to connect to the common electrode of the LEDs. Other aspects include components, devices, systems, improvements, methods, processes, applications, computer readable mediums, and other technologies related to any of the above.

BRIEF DESCRIPTION OF THE DRAWINGS

Embodiments of the disclosure have other advantages and features which will be more readily apparent from the following detailed description and the appended claims, when taken in conjunction with the accompanying drawings, in which:

The figures depict various embodiments for purposes of illustration only. One skilled in the art will readily recognize from the following discussion that alternative embodiments of the structures and methods illustrated herein may be employed without departing from the principles described herein.

DETAILED DESCRIPTION OF THE PREFERRED EMBODIMENTS

The figures and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Figure 1:
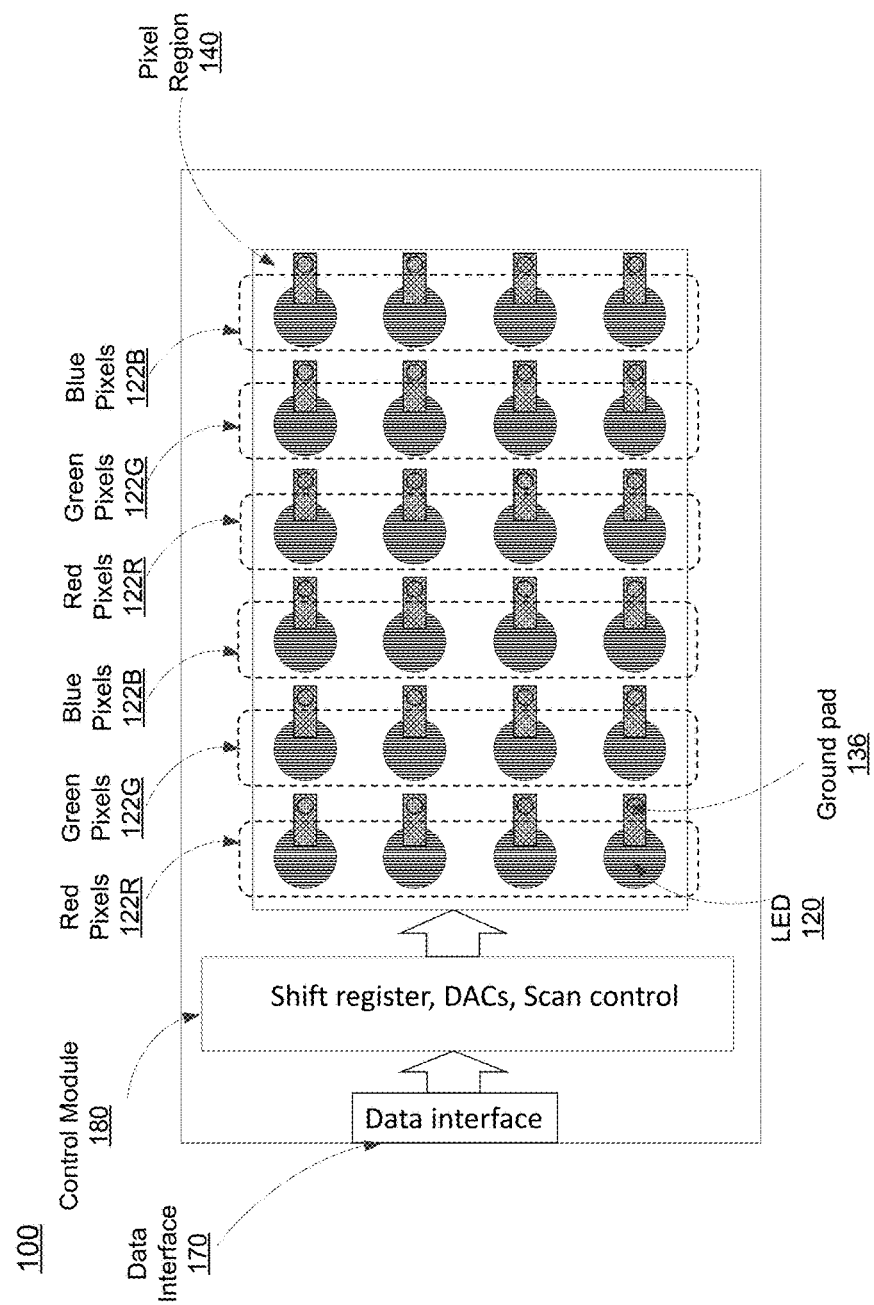
FIG. 1 is a top view of an example LED display panel, according to one embodiment.

FIG. 1 is a top view of an example LED display panel 100, according to one embodiment. The display panel 100 includes a data interface 170, a control module 180 and a pixel region 140. The data interface 170 receives data defining the image to be displayed. The source(s) and format of this data will vary depending on the application. The control module 180 receives the incoming data and converts it to a form suitable to drive the pixels in the display panel. The control module 180 may include digital logic and/or state machines to convert from the received format to one appropriate for the pixel region 140, shift registers or other types of buffers and memory to store and transfer the data, digital-to-analog converters and level shifters, and scan controllers including clocking circuitry.

The pixel region 140 includes an array of pixels that includes monolithically integrated LEDs, pixel drivers and micro-reflectors. The pixels include LEDs 120 monolithically integrated with pixel drivers, for example as described in U.S. patent application Ser. No. 15/135,217 "Semiconductor Devices with Integrated Thin-Film Transistor Circuitry," which is incorporated by reference herein. In this example, the display panel 100 is a color RGB display panel. It includes red, green and blue pixels, arranged in columns. Columns 122R are red pixels, columns 122G are green pixels and columns 122B are blue pixels. Within each pixel, an LED 120 is controlled by a pixel driver. The pixel makes contact to a supply voltage (not shown) and ground via a ground pad 136, and also to a control signal. Although not shown in FIG. 1, the p-electrode of the LED 120 and the output of the driving transistor are positioned underneath the LED, and they are electrically connected by bonding metal. The LED current driving signal connection (between p-electrode of LED and output of the pixel driver), ground connection (between n-electrode and system ground), the Vdd connection (between source of the pixel driver and system Vdd), and the control signal connection to the gate of the pixel driver are made in accordance with various embodiments, for example as described in U.S. patent application Ser. No. 15/135,217 "Semiconductor Devices with Integrated Thin-Film Transistor Circuitry," which is incorporated by reference herein.

FIG. 1 is merely a representative figure. Other designs will be apparent. For example, the pixel driver circuitry does not have to be a TFT based circuitry, it can be Si CMOS based driver IC as well. There can also be a wide variety of pixel sizes and the size of the overall display region can also vary widely. In a preferred embodiment, the LEDs 120 are micro-LEDs with a size preferably not larger than 20 microns. The colors do not have to be red, green and blue, and there do not have to be equal numbers of each color pixel. They also do not have to be arranged in columns or stripes. A set of four color pixels could be arranged as a 2×2 square, for example. Individual pixel cells could also be arranged to share row or column addressing, thus reducing the total number of row or column traces. As one example, apart from the arrangement of a square matrix of pixels shown in FIG. 1, an arrangement of hexagonal matrix of pixels can also be used to form the display panel 100.

Figure 2:
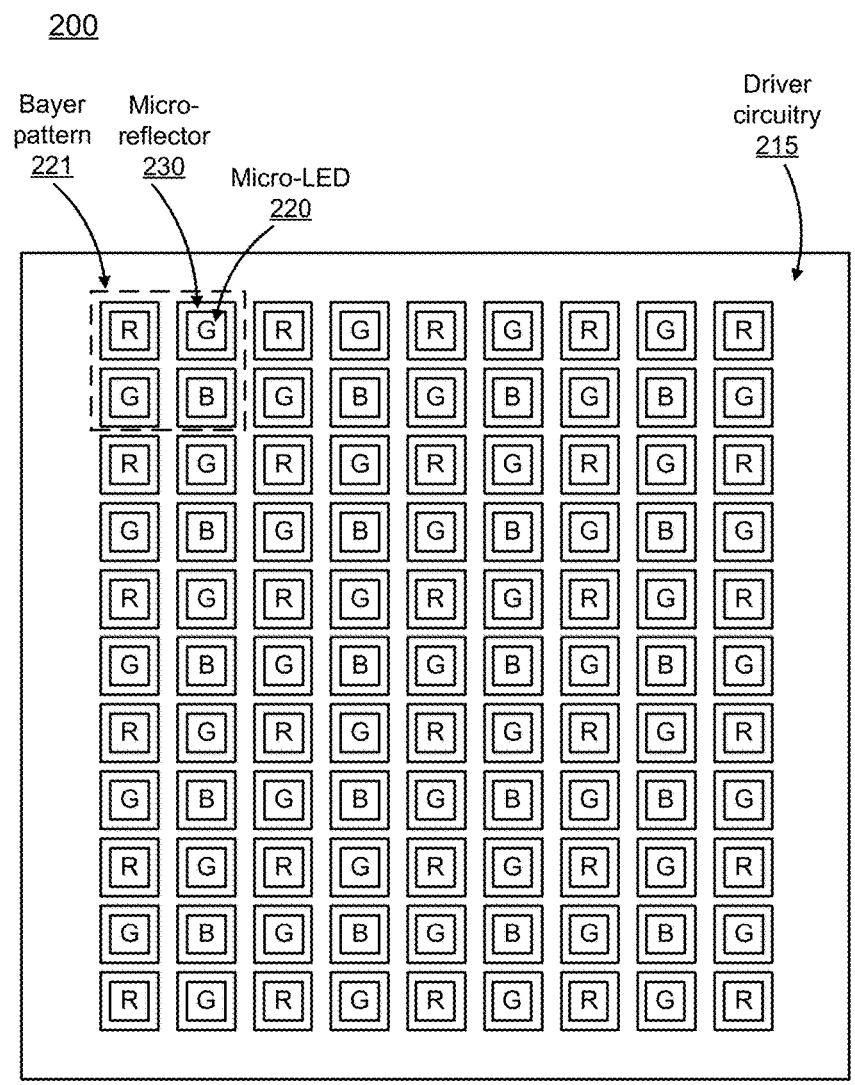
FIG. 2 is a top view of an example multi-color display panel with interleaved red, green and blue micro-LEDs and integrated micro-reflectors, according to one embodiment.

FIG. 2 is a top view of an example multi-color display panel 200 with interleaved pixels of red, green and blue micro-LEDs 220, where the different colors are denoted by R, G and B. In this example, only the pixel region is shown. The pixel region includes a Si based pixel driver integrated circuit 215, which contains an array of pixel driver circuitry, and arrays of different color micro-LEDs 220 monolithically integrated on the pixel driver IC. Each micro-LED is electrically coupled to the output of the corresponding pixel driver circuitry. In one embodiment, the micro-LEDs in the multi-color display panel 200 are micro-LEDs with a size preferably not larger than 20 microns.

In this example, the LEDs are arranged in a Bayer pattern, as indicated by the dashed boundary 221. In a Bayer pattern, two green, one red and one blue LED provide the different color components in one color pixel of the image. Other arrangements are also possible. For example, the micro-LEDs could be arranged in vertical, diagonal or horizontal stripes (such as in FIG. 1). The different color LEDs preferably are arranged to reduce the effects caused by their relative spatial offset. In addition, the display panel could be monochrome, rather than multi-color.

With respect to fabrication, the micro-LEDs are fabricated using epitaxial layers. In one approach, the micro-LEDs of a monochromatic AMLED micro display are fabricated by transferring the LED epitaxial layer from the growth substrate to the Si based pixel driver IC wafer through eutectic wafer bonding followed by removal of the growth substrate. Then the epi-on-IC template is subjected to standard semiconductor process such as photolithography patterning and etching to form isolated micro-LEDs. In another approach, the array of different color micro-LEDs is integrated onto the Si based pixel driver IC 215 by transferring the pre-fabricated micro-LED arrays from a host substrate to the Si based pixel driver IC via gold-gold, gold-indium or gold-tin eutectic bonding. Additional fabrication techniques are described in U.S. patent application Ser. No. 15/007,959 "Semiconductor Apparatus and Method of Manufacturing the Same" and Ser. No. 15/269,954 "Making Semiconductor Devices with Alignment Bonding and Substrate Removal," both of which are incorporated herein by reference in their entirety.

LEDs 220 typically produce widely diverging light. Light from the micro-LEDs that is captured by the optics in the display/projector system is useful light. However, light that is not captured is wasted light. In FIG. 2, micro-reflectors 230 (represented in FIG. 2 as a square annulus around each LED) are used to reduce the divergence of light from the LEDs 220, thus coupling more light from the micro-LEDs 220 into the rest of the optical system.

Figure 3:
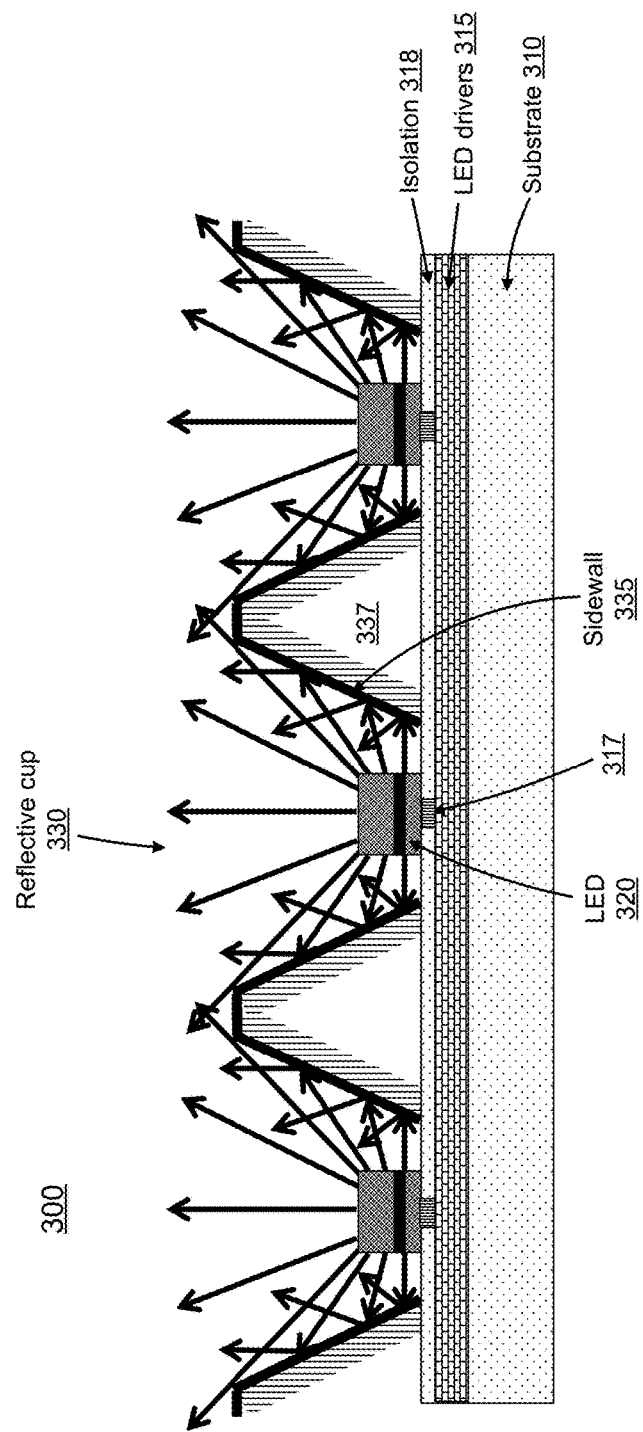
FIG. 3 is a cross-section view of an array of micro-LEDs with integrated micro-reflectors.

FIGS. 3-14 show different examples of micro-reflectors that improve the angular distribution of light produced by the micro-LED array. FIGS. 3-8 show different shapes for the reflective cups as seen in cross-section. FIG. 3 is a cross-section view of an array of micro-LEDs with integrated micro-reflectors. The chip in FIG. 3 includes LED drive circuitry 315 integrated on substrate 310, which drives each micro-LED independently. The array of micro-LEDs 320 are integrated on top of the drive circuitry 315, separated by an isolation layer 318 with electrical connections 317 connecting the LEDs 320 and corresponding drive circuitry 315. The active area of the LED is shown as a solid black bar. Typically, a non-trivial amount of light is emitted from the sidewalls of the LED mesa in addition to emitting in all directions through the top of the active area. This causes a wide divergence of the emitted light and a large angular extent of the far field profile, possibly up to 180 degrees. If the collection optics has a moderate to slow F/#, then a fair amount of light will not be collected, reducing the overall optical efficiency.

In FIG. 3, the chip also includes integrated micro-reflectors 330. In this example, a support structure 337 is integrated on the chip and the sidewalls 335 of the support structure are reflective. For example, they may be coated with a metal or other reflective coatings. The micro-reflectors 330 are aligned with the micro-LEDs 320 to reduce a divergence of the light produced by the LEDs. In this particular example, there is one micro-reflector 330 per LED 320 and each micro-reflector 330 reduces the divergence of light produced by the corresponding LED 320. In addition, the micro-reflectors 330 are cup-shaped (frustum) with straight reflective sidewalls 335. The micro-LEDs 320 are positioned at the base of the cup.

Figure 4B:
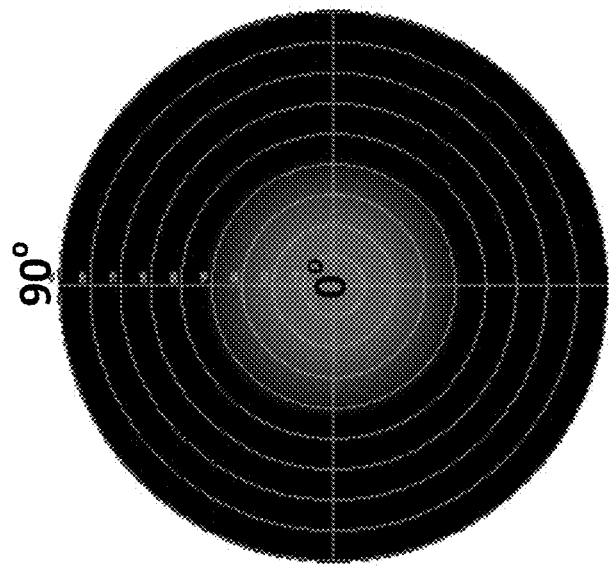
FIGS. 4A-4B are simulations of the far-field light distribution of a micro-LED, without and with a reflective cup, respectively.
Figure 4A:
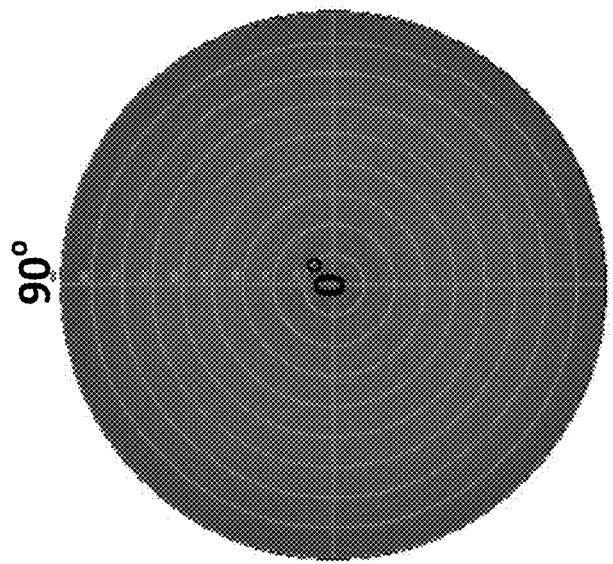

FIGS. 4A-4B are simulations of the far-field angular light distribution of a micro-LED, without and with a reflective cup, respectively. These figures show relative optical strength of the far-field plotted in polar coordinates. The radial coordinate ranges from 0 to 90 degrees and represents the angular direction measured relative to the on-axis direction (perpendicular to the chip surface). For convenience, this will be referred to as the divergence angle. A divergence angle of 0 degrees corresponds to light propagating perpendicular to the top surface of the micro-LED, and a divergence angle of 90 degrees corresponds to light propagating parallel to the top surface of the micro-LED. In FIG. 4A (no reflective cup), the far-field light distribution is relatively uniform as a function of divergence angle. In FIG. 4B, the reflective cup concentrates the light to a smaller cone with a maximum divergence angle of approximately +/−35 degrees.

Figure 5:
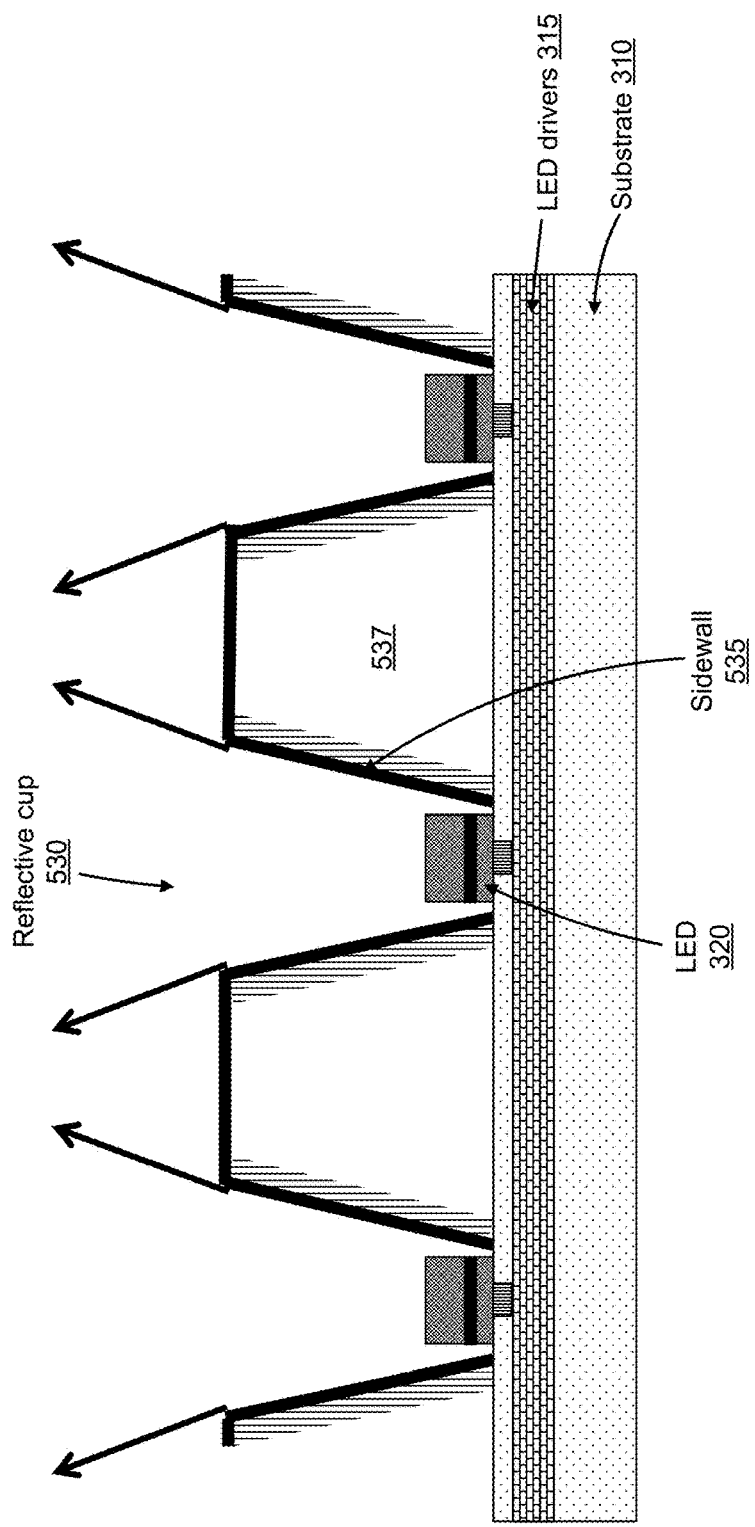
FIG. 5 is a cross-section view of an array of micro-LEDs with integrated micro-reflectors featuring steeper sidewalls.

The divergence angle can be controlled by changing the geometry of the reflective cup. Typically, increasing the height and the sidewall steepness (the slope) of the reflective cup can further reduce the divergence angle. FIG. 5 shows reflective cups 530 that are taller than the reflective cups 330 of FIG. 3. The sidewalls 535 of the support structure 537 are more vertical compared to FIG. 3.

Figure 6C:
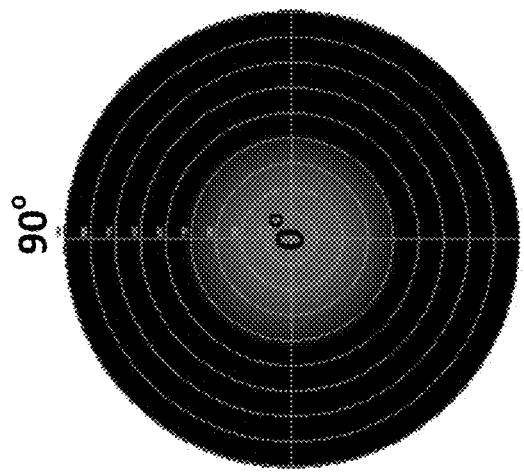
FIGS. 6A-6C are simulations of the far-field light distribution of a micro-LED using reflective cups of different heights.
Figure 6B:
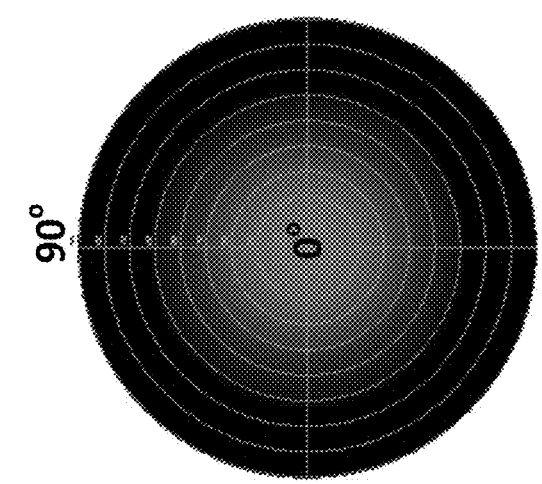
Figure 6A:
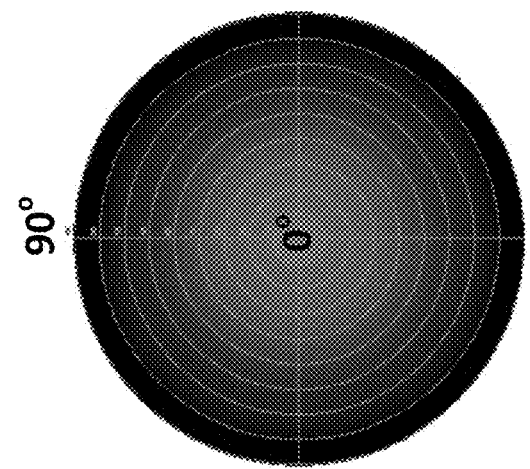

FIGS. 6A-6C are simulations of the far-field angular light distribution of a micro-LED using reflective cups of different heights and sidewall slope. The reflective cup for FIG. 6A has the shortest cup and the least steep sidewall slope, and the far-field profile has the largest divergence with a maximum divergence angle of approximately +/−70 degrees. The reflective cup of FIG. 6B has a steeper sidewall slope and a taller cup and thus a lower maximum divergence, and the reflective cup of FIG. 6C has the tallest cup with the steepest sidewall slope and the least divergence with a maximum divergence angle of approximately +/−35 degrees. With the smaller divergence angle, collection optics with a slower F/# can be used to achieve equivalent collection efficiency, which can reduce the size and cost of the projection system.

However, increasing the height as well as the sidewall slope of the reflective cup will pose more fabrication challenges and more reliability issues. Therefore, depending on the application requirement, an optimal geometry of the micro-reflector should be adopted to reduce the divergence angle of micro-LED light without introducing significant fabrication challenges. In general, the sidewall angle (the angle between the sidewall of the cup and the axis normal to the display surface) should be less than 45 degrees, and the cup height should be greater than the micro-LED height and greater than twice the micro-LED diameter to achieve effective suppression of the divergence angle. An optimal cup height typically exists for each sidewall angle (<45 degrees), at which the divergence angle is minimized and further increasing the cup height will not reduce the divergence angle any further. In the most practical cases, the divergence angle can be reduced to around +/−35 degrees, when the sidewall angle is 36 degrees and the optimal cup height is around 3.6 times the bottom diameter of the cup. Further reducing the divergence angle is possible by making the cup steeper and taller. However, it will pose more fabrication challenges. Depending on the F/# of the collection optics, the collection efficiency of optical power can be increased by a factor of 6~10× with the adoption of micro-reflectors. The on-axis brightness can be increased by at least 10 times.

Figure 7:
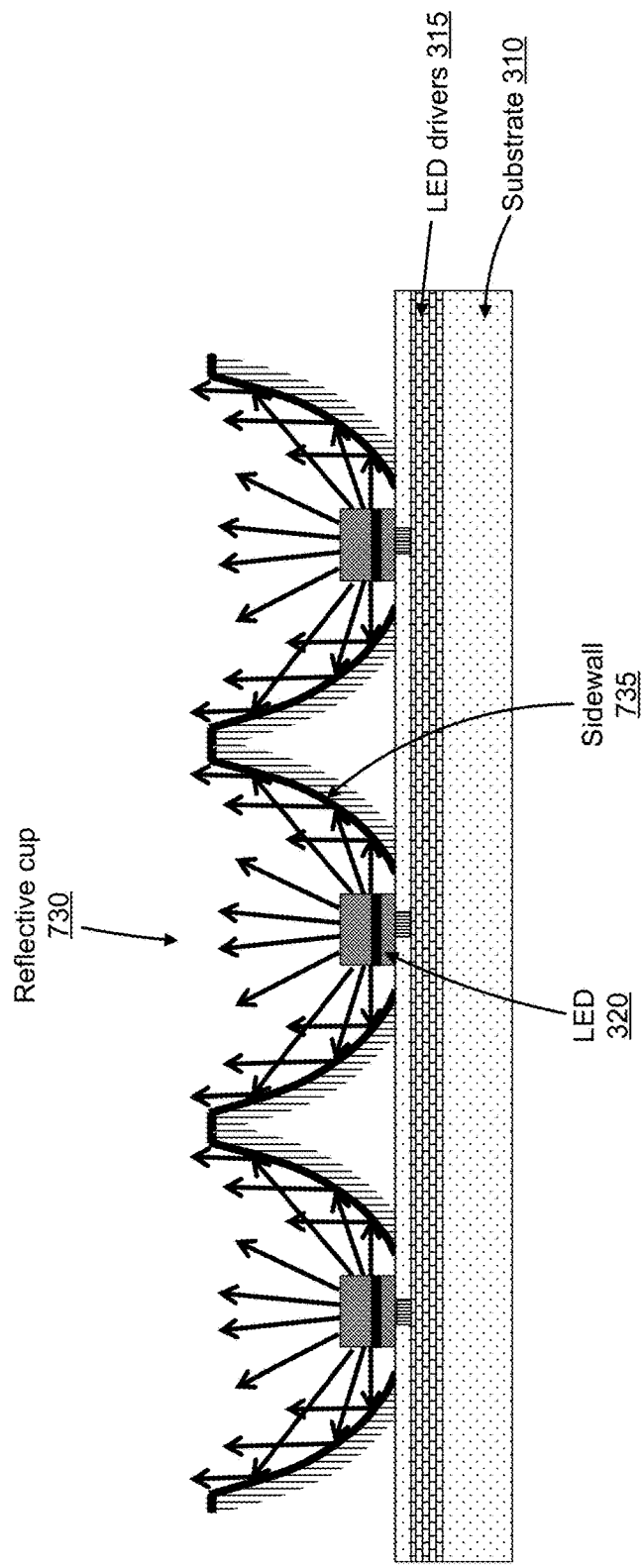
FIG. 7 is a cross-section view of an array of micro-LEDs with integrated micro-reflectors with curved sidewalls.

In FIG. 7, the reflective cups 730 have curved sidewalls 735. When the micro-LED is designed to be much smaller than the base of the reflection cup, it behaves like a point source. Then a sidewall 735 with parabolic cross section will better collimate the light reflected from the sidewalls, resulting in a smaller divergence angle of the output light beam. In one approach, the reflective cups 730 are fabricated with a modeled etch mask and subsequently dry etching process to transfer the molded shape into the supporting structure. The shape of the sidewalls can be optimized using the design principles of non-imaging concentrators.

Figure 8:
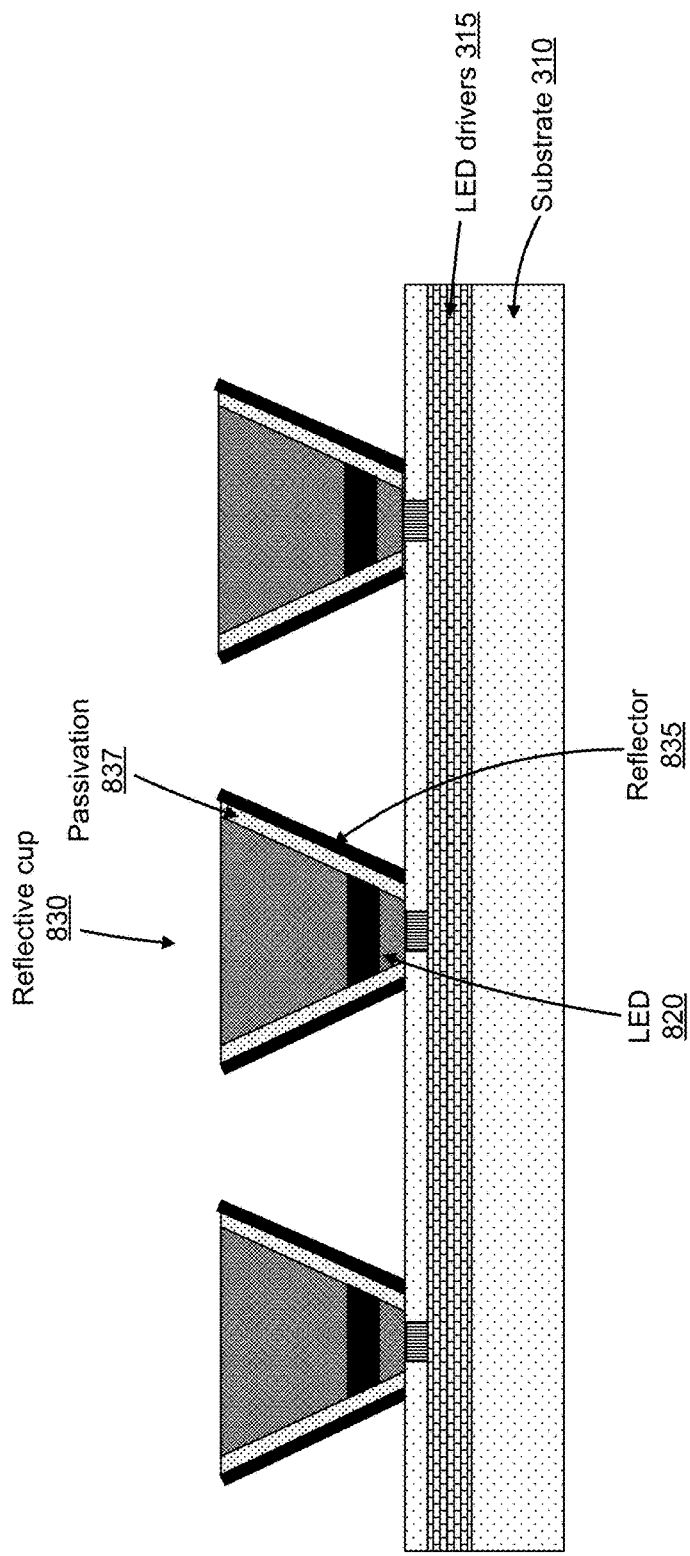
FIG. 8 is a cross-section view of an array of micro-LEDs with integrated micro-reflectors supported by the LED mesas.

FIG. 8 shows an alternate structure for reflective cups 830, in this case with straight sidewalls 835. Rather than coating a separate support structure as in FIGS. 3-7, in FIG. 8, the LED mesa 820 itself functions as the support structure. It is built up in the shape of the interior of the reflective cup. The sidewalls are then coated with a passivation layer 837 and a reflective layer 835.

Figure 9B:
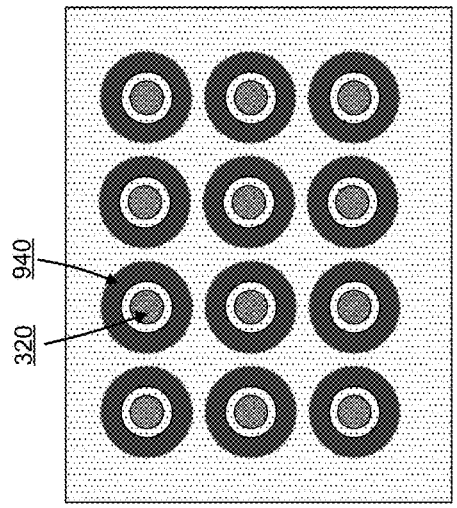
FIGS. 9A-9B are top views of different micro-reflectors for micro-LEDs arranged in a rectangular array.
Figure 9A:
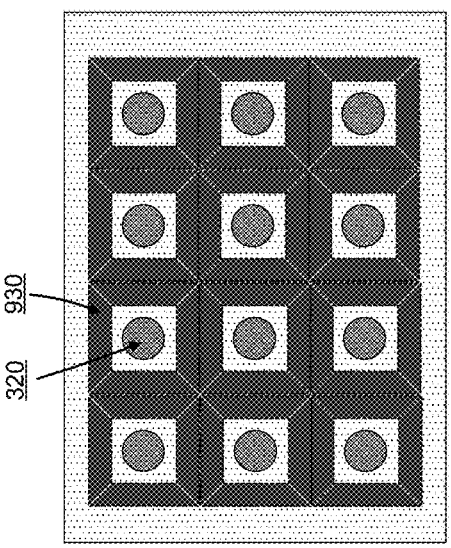

FIGS. 9-10 show different shapes for the reflective cups as seen from a top view or plan view. These views show a substrate with an array of micro-LEDs 320 and surrounding micro-reflectors. FIGS. 9A-9B show two different variations for LEDs 320 arranged in a rectangular array. In FIG. 9A, the plan cross-section of the reflective cups 930 is square or rectangular. For each micro-LED 320, the reflective cup 930 contains four flat sidewalls which are the sides of a frustum of a pyramid. In FIG. 9B, the plan cross-section is a circle. The reflective cup 940 has a sidewall in the shape of a frustum of a cone.

In another aspect, the reflective cups 930 in FIG. 9A for adjacent LEDs are electrically connected to each other (assuming the reflective layer is electrically conducting), and the reflective cups 940 in FIG. 9B are electrically isolated from each other. It does not have to be this way. The reflective cups 930 in FIG. 9A could be isolated if buffer space is provided between adjacent cups or if the reflective material on the frustum sidewall does not extend all the way to the boundary with the adjacent cup. Similarly, the cups 940 in FIG. 9B could be electrically connected if the cups were expanded so that they touch or overlap. Alternately, the reflective coating can simply be extended to cover the interstitial areas between adjacent reflective cups.

Figure 10B:
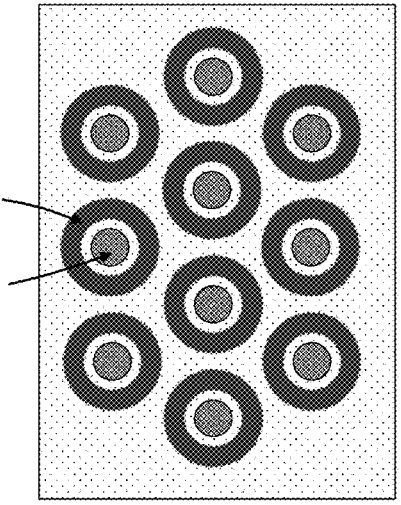
FIGS. 10A-10B are top views of different micro-reflectors for micro-LEDs arranged in a hexagonal array.
Figure 10A:
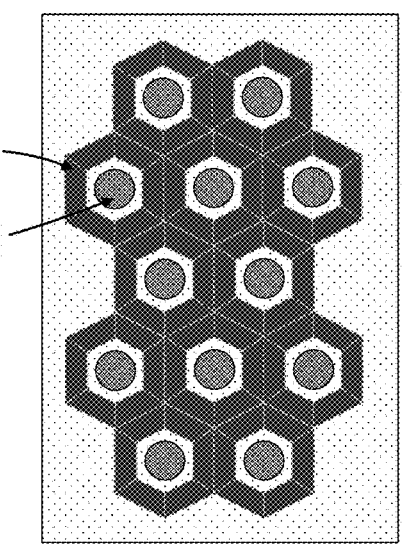

FIGS. 10A-10B show two different variations for LEDs 320 arranged in a hexagonal array. In FIG. 10A, the plan cross-section of the reflective cups 1030 is hexagonal. For each LED 320, the reflective cup 1030 contains six flat sidewalls which are the sides of a frustum of a pyramid with a hexagonal base. In FIG. 10B, the plan cross-section is a circle. The reflective cup 1040 has a sidewall in the shape of a frustum of a cone.

Other variations of the plan view are also possible. For example, the plan cross-section could be polygons other than rectangular of hexagonal, or they could be irregular polygons or non-circular curves (e.g., ellipses).

Figure 11:
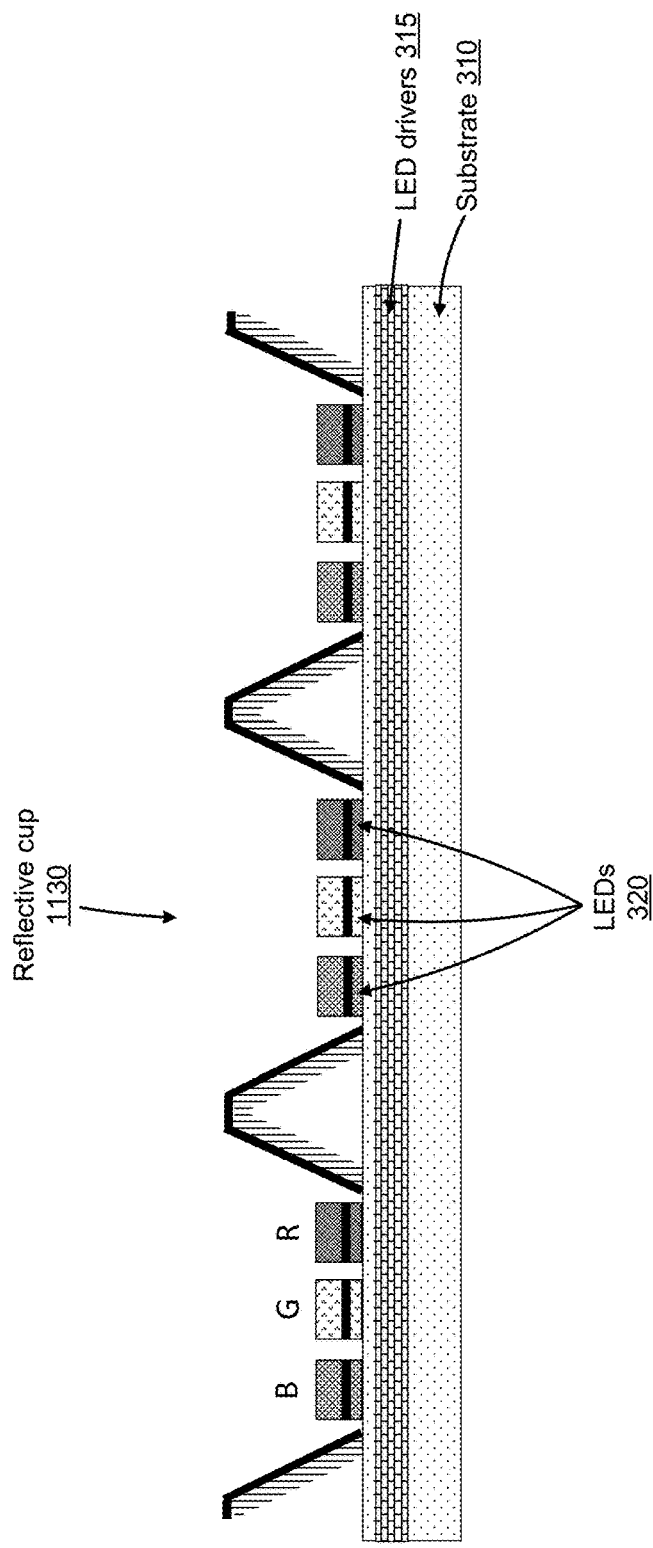
FIG. 11 is a cross-section view with one micro-reflector for each group of three micro-LEDs.

FIGS. 11-12 show cases where there is one micro-reflector for two or more LEDs. In FIG. 11, the micro-LEDs 320 are arranged into groups containing one of each color micro-LED. There is one micro-reflector 1130 for each group of three LEDs. The micro-reflector reduces the divergence of the output light from the R, G, B micro-LEDs simultaneously.

Figure 12B:
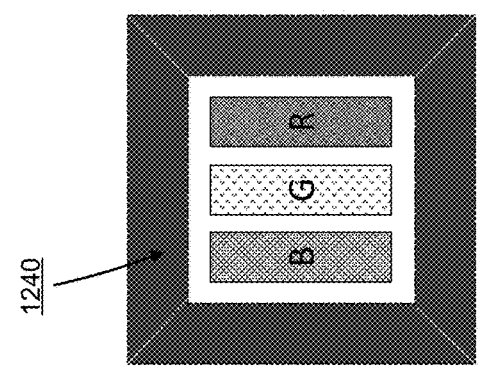
FIGS. 12A-12D are top views of different micro-reflectors, where there is one micro-reflector for each group of color micro-LEDs.
Figure 12D:
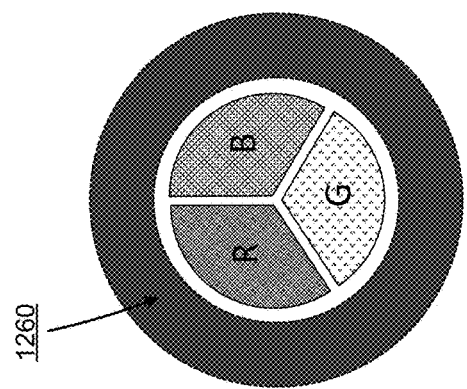
Figure 12A:
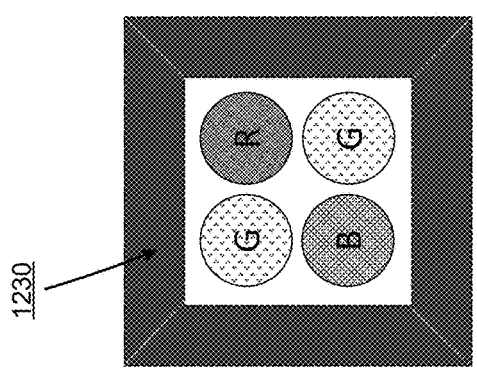
Figure 12C:
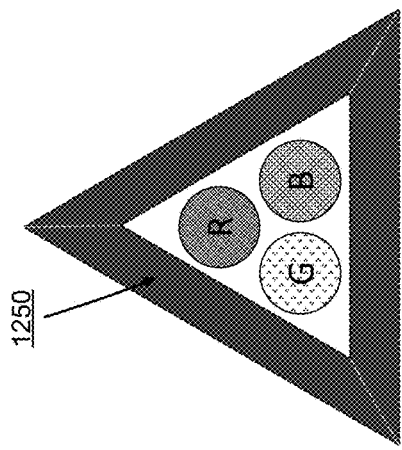

FIGS. 12A-12D show some variations on how R, G and B micro-LEDs may be arranged within a micro-reflector. In FIG. 12A, the micro-LEDs are arranged in a Bayer pattern, with four LEDs per square micro-reflector 1230. In FIG. 12B, the micro-reflector 1240 is still square, but the micro-LEDs are rectangular bars. In FIG. 12C, the micro-reflector 1250 is triangular, as might be used in hexagonal arrays. In FIG. 12D, the micro-reflector is circular and the micro-LEDs are wedge-shaped.

Figure 13A:
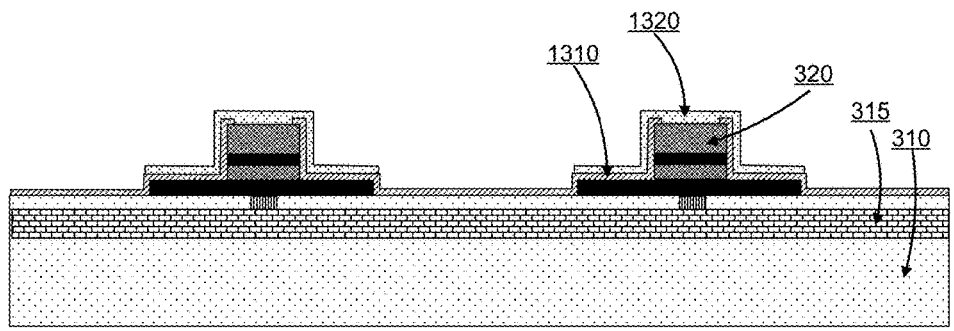
FIGS. 13A-13C are cross-section views illustrating fabrication of a display panel, with micro-reflectors that also provide electrical connection.
Figure 13B:
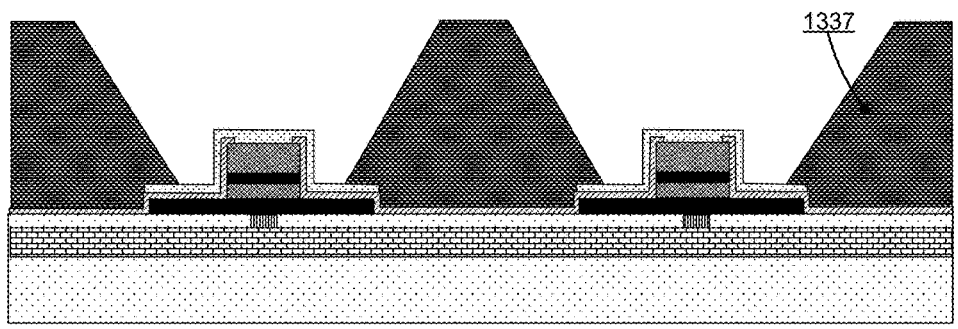
Figure 13C:
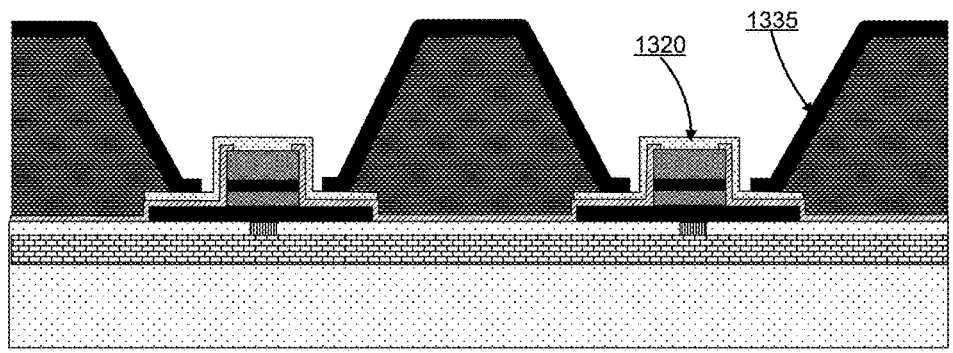

The micro-reflectors may also perform functions in addition to their optical functions. For example, if the micro-reflectors are conductive, then they may also be used as electrical contacts to the LEDs. FIGS. 13-14 illustrate two examples of this. FIGS. 13A-13C are cross-section views illustrating fabrication of a display panel. In FIG. 13A, the LED mesa 320 has been created. The chip also includes a substrate 310, LED drive circuitry 315, and an isolation layer with electrical connections to one electrode of the micro-LED. This is similar to what is shown in FIG. 3. Passivation layer 1310 covers most of the top of the structure, and an indium tin oxide (or other transparent conductor) layer 1320 makes electrical contact to the other electrode of the micro-LED. In FIG. 13B, the support structures 1337 are integrated onto the substrate. In FIG. 13C, these are coated by a metal layer 1335, which forms the sidewalls of the micro-reflector and also makes electrical contact to the indium tin oxide 1320. The metal layer 1335 is patterned to not block light from the micro-LED. The metal layer 1335 then also functions as the common electrode for the micro-LEDs.

Figure 14A:
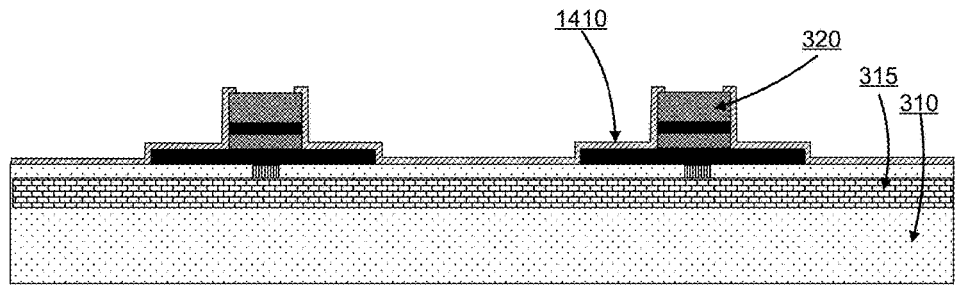
FIGS. 14A-14C are cross-section views illustrating another method for fabrication of a display panel, with micro-reflectors that also provide electrical connection.
Figure 14B:
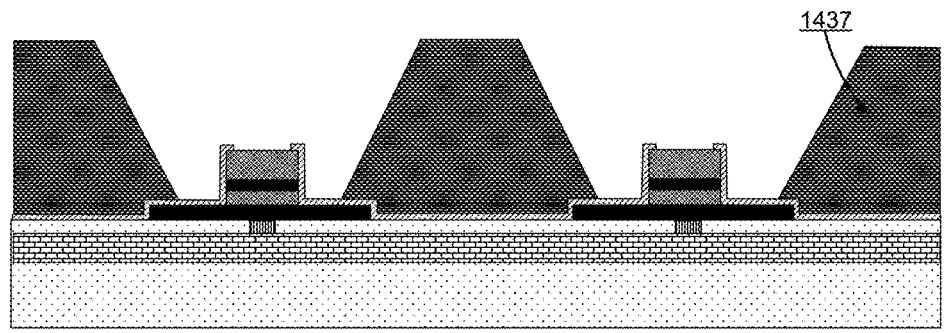
Figure 14C:
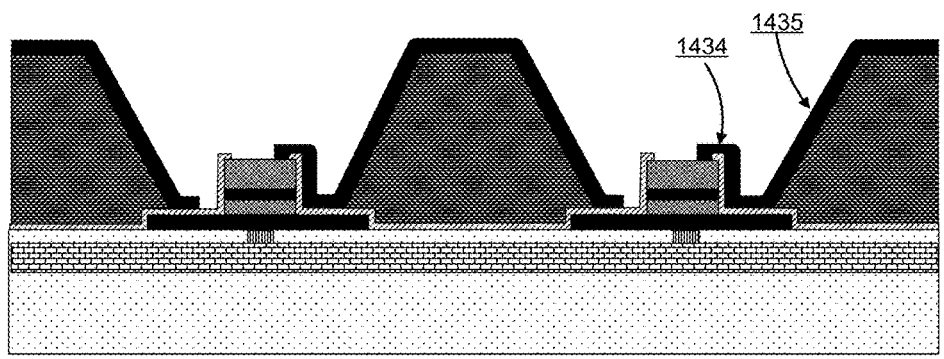

FIGS. 14A-14C illustrate an alternate implementation in which a contact finger, rather than indium tin oxide, makes the connection to the micro-LED. FIG. 14A shows the same structure as FIG. 13A but without the indium tin oxide. At this point, the chip includes a passivation layer 1410 but there is no indium tin oxide. In FIG. 14B, the support structures 1437 are integrated onto the substrate. In FIG. 14C, these are coated by a metal layer 1435, which forms the sidewalls of the micro-reflector. The metal layer 1435 is also patterned to form a contact finger 1434 that makes electrical contact to one electrode of the micro-LED 320, but without blocking the entire LED output. The metal layer 1435 then also functions as the common electrode for the micro-LEDs.

Figure 15:
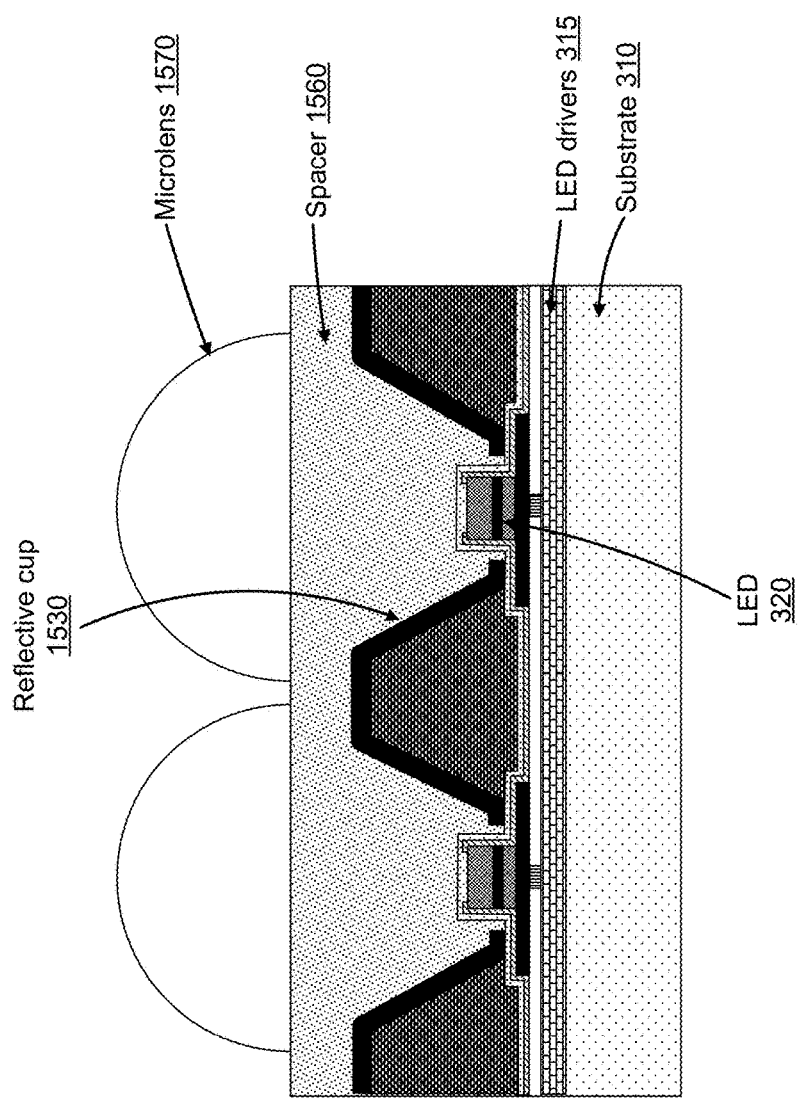
FIG. 15 is a cross-section view of an array of micro-LEDs with integrated micro-reflectors and microlenses.

In yet another aspect, the micro-reflectors described above can also be combined with other techniques for controlling the directionality of light from the LEDs. FIG. 15 shows the structure of FIG. 13C, but with an additional spacer layer 1560 and microlens array 1570. The microlenses 1570 are positioned to further increase the directionality of light produced by the micro-LEDs. Furthermore, with the adoption of microlens structure, the spacer fills up the reflective cup to increase the refractive index of the medium surrounding the micro-LED. As a result, the light extraction efficiency of the micro-LED can be increased to further enhance the brightness of the micro display panel. Additional configurations using microlenses are described in U.S. patent application Ser. No. 15/269,956 "Display Panels with Integrated Microlens Array," which is incorporated by reference in its entirety.

Figure 16:
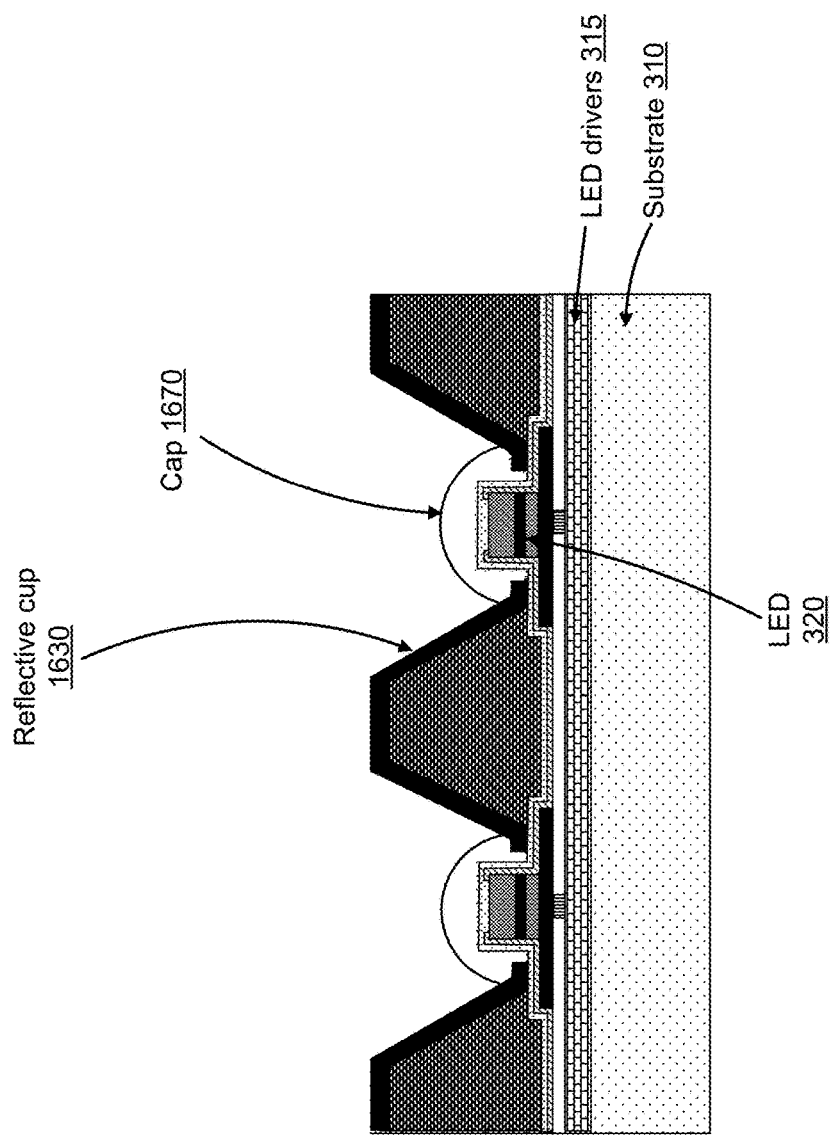
FIG. 16 is a cross-section view of another array of micro-LEDs with integrated micro-reflectors and microlenses.

FIG. 16 shows another example of joint implementation of micro-reflector 1630 and other optical structures. In this example, a higher index micro-cap 1670 is positioned inside the reflective cup 1630 around the micro-LED 320. The micro-LED is immersed in the micro-cap 1670, so that most of the light reaches the micro-cap's surface propagating approximately normal to the surface and can thus transmit through the surface with low reflection and without significant change in the field distribution. Because the micro-cap 1670 has a higher refractive index than air, light extraction efficiency from the LED is increased. The light extracted from the micro-LED is subsequently collimated by the reflective cup 1630 to reduce the divergence angle.

Although the detailed description contains many specifics, these should not be construed as limiting the scope of the invention but merely as illustrating different examples. It should be appreciated that the scope of the disclosure includes other embodiments not discussed in detail above. Various other modifications, changes and variations which will be apparent to those skilled in the art may be made in the arrangement, operation and details of the method and apparatus disclosed herein without departing from the spirit and scope as defined in the appended claims. Therefore, the scope of the invention should be determined by the appended claims and their legal equivalents.

What is claimed is:

1. A display panel comprising:
   a substrate;
   an array of micro-LEDs that produce light;
   an array of pixel driver circuits that is electrically coupled to the array of micro-LEDs, wherein the pixel driver circuits drive corresponding micro-LEDs and each micro-LED is individually controllable; and
   an array of micro-reflectors aligned to the micro-LEDs to reduce a divergence of the light produced by the micro-LEDs, wherein the micro-reflectors are reflective cups, the micro-LEDs positioned at a base of the reflective cups;
   wherein the arrays of pixel driver circuits, micro-LEDs and micro-reflectors are all integrated on the substrate.

2. The display panel of claim 1, wherein the array of micro-reflectors includes one micro-reflector per micro-LED, each micro-reflector reducing the divergence of the light produced by the corresponding micro-LED.

3. The display panel of claim 1, wherein the array of micro-reflectors includes one micro-reflector per group of two or more micro-LEDs, each micro-reflector reducing the divergence of the light produced by the micro-LEDs in the corresponding group.

4. The display panel of claim 3, wherein the array of micro-LEDs includes different color micro-LEDs, and each group contains a same number of each color micro-LED.

5. The display panel of claim 1, wherein the reflective cups comprise a reflective coating applied to sidewalls of the micro-LEDs.

6. The display panel of claim 1, wherein the reflective cups comprise support structures integrated on the substrate between the micro-LEDs, the support structures having reflective surfaces.

7. The display panel of claim 1, wherein the reflective cups have straight sidewalls.

8. The display panel of claim 1, wherein the reflective cups have curved sidewalls.

9. The display panel of claim 1, wherein the reflective cups have a plan cross-section that is one of circular, polygonal or irregular.

10. The display panel of claim 1, wherein the reflective cups are taller than the micro-LEDs, and a height of the reflective cups is at least twice a lateral size of the micro-LEDs.

11. The display panel of claim 1, wherein the reflective cups have sidewalls with a sidewall angle that is steeper than 45 degrees.

12. The display panel of claim 1, wherein the micro-reflectors reduce a maximum divergence angle of the light produced by the micro-LEDs by at least 60%.

13. The display panel of claim 1, wherein the micro-reflectors increase an on-axis brightness of the light produced by the micro-LEDs by at least 10×.

14. The display panel of claim 1, further comprising:
    an array of microlenses aligned to the micro-LEDs and micro-reflectors, the microlenses positioned above the micro-reflectors to further reduce the divergence of the light produced by the micro-LEDs.

15. The display panel of claim 1, further comprising:
    an array of micro-caps positioned inside the micro-reflectors, the micro-LEDs immersed in the micro-caps, the micro-caps increasing a light extraction efficiency of the micro-LEDs without adversely affecting the reduction of divergence achieved by the micro-reflectors.

16. The display panel of claim 14, further comprising:
    a spacer between the micro-LEDs and the microlenses.

17. A display panel comprising:
    a substrate;
    an array of micro-LEDs that produce light;
    an array of pixel driver circuits that is electrically coupled to the array of micro-LEDs, wherein the pixel driver circuits drive corresponding micro-LEDs and each micro-LED is individually controllable; and
    an array of micro-reflectors aligned to the micro-LEDs to reduce a divergence of the light produced by the micro-LEDs, wherein the micro-reflectors are reflective cups coated with a reflective metal layer, the micro-LEDs are positioned at a base of the reflective cups, and the reflective metal layer also makes electrical contact with one electrode of the micro-LEDs;
    wherein the arrays of pixel driver circuits, micro-LEDs and micro-reflectors are all integrated on the substrate.

18. The display panel of claim 17, wherein the reflective metal layer is electrically connected to a common electrode of the micro-LEDs through a transparent conducting layer.

19. The display panel of claim 17, wherein the reflective metal layer is electrically connected to a common electrode of the micro-LEDs by contact fingers.

20. A display panel comprising:
    a substrate;
    an array of micro-LEDs that produce light;
    an array of pixel driver circuits that is electrically coupled to the array of micro-LEDs, wherein the pixel driver circuits drive corresponding micro-LEDs and each micro-LED is individually controllable; and an array of micro-reflectors aligned to the micro-LEDs to reduce a divergence of the light produced by the micro-LEDs, wherein the micro-reflectors are reflective cups coated with a reflective metal layer, the micro-LEDs are positioned at a base of the reflective cups, and the reflective metal layers of adjacent reflective cups are electrically connected;

wherein the arrays of pixel driver circuits, micro-LEDs and micro-reflectors are all integrated on the substrate.

\* \* \* \* \*